United States Patent
Beyne

(10) Patent No.: US 8,742,590 B2
(45) Date of Patent: Jun. 3, 2014

(54) METHOD FOR FORMING ISOLATION TRENCHES

(75) Inventor: Eric Beyne, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/310,521

(22) Filed: Dec. 2, 2011

(65) Prior Publication Data

US 2012/0139127 A1 Jun. 7, 2012

Related U.S. Application Data

(60) Provisional application No. 61/420,653, filed on Dec. 7, 2010.

(51) Int. Cl.
*H01L 23/48* (2006.01)
(52) U.S. Cl.
USPC 257/774; 257/773; 257/E21.54; 257/E21.573; 257/E21.585; 257/E21.597; 438/675
(58) Field of Classification Search
USPC ........... 257/774, E23.011, E21.597; 438/675; 275/773, 774, E21.54, E21.573, 275/E21.585, E21.597, E23.011
See application file for complete search history.

(56) References Cited

U.S. PATENT DOCUMENTS

| | | | | |
|---|---|---|---|---|
| 7,959,819 | B2 * | 6/2011 | Lai et al. | 216/59 |
| 2001/0038128 | A1 * | 11/2001 | Woolery et al. | 257/363 |
| 2008/0171432 | A1 * | 7/2008 | Clevenger et al. | 438/619 |
| 2009/0001502 | A1 * | 1/2009 | Tilke et al. | 257/506 |
| 2010/0264538 | A1 * | 10/2010 | Swinnen et al. | 257/737 |
| 2011/0291287 | A1 * | 12/2011 | Wu et al. | 257/774 |
| 2012/0013022 | A1 * | 1/2012 | Sabuncuoglu Tezcan et al. | 257/774 |
| 2012/0280381 | A1 * | 11/2012 | Beyne et al. | 257/680 |

FOREIGN PATENT DOCUMENTS

WO    WO 2009050207 A1 *  4/2009

* cited by examiner

*Primary Examiner* — Ermias Woldegeorgis
(74) *Attorney, Agent, or Firm* — Knobbe, Martens, Olson & Bear, LLP.

(57) ABSTRACT

A method is provided for forming at least one TSV interconnect structure surrounded by at least one isolating trench-like structure having at least one airgap. The method comprises at least the steps of providing a substrate having a first main surface and producing simultaneous at least one a TSV hole and a trench-like structure surrounding the TSV hole and separated by remaining substrate material. The method also comprises thereafter depositing a dielectric liner in order to smoothen the sidewalls of the etched TSV hole and to pinch-off the opening of the trench-like structure at the first main surface of the substrate in order to create at least one airgap in said trench-like structure and depositing a conductive material in said TSV hole in order to create a TSV interconnect. A corresponding substrate is also provided.

23 Claims, 14 Drawing Sheets

METHOD FOR FORMING ISOLATION TRENCHES

CROSS-REFERENCE TO RELATED APPLICATIONS

This application claims the benefit under 35 U.S.C. §119 (e) of U.S. provisional application Ser. No. 61/420,653, filed Dec. 7, 2010, the disclosure of which is hereby expressly incorporated by reference in its entirety and is hereby expressly made a portion of this application.

FIELD OF THE INVENTION

Electrical connections in semiconductor devices are provided. More particularly, methods are provided for forming isolation trenches comprising airgaps and interconnect structures such as Through Silicon Vias (TSV) to be used in the stacking of semiconductor devices. The embodiments further relate to devices thus obtained.

BACKGROUND OF THE INVENTION

With the continued scaling of IC technology, due to the large amount of electronic circuits on a small area, the density of chip input/output connection pads (I/O's) continues to increase. This leads to an increasing bandwidth of interconnects between integrated circuits (IC's) and/or other system elements. For short interconnects, electrical signal lines maintain the highest capacity and speed. In order to keep up with the increasing speed and density requirements, system in a package (SIP) technology is increasingly used. This creates the need for 3-dimensional interconnects.

Three-dimensional (3D) integration requires the realization of electrical interconnections that go through the bulk of the substrate (wafer) whereon or wherein the active devices are realized. These are the so-called Through-Si-Via (TSV) connections. One particular approach to realizing TSV connections is the so-called via-middle approach, where the TSV is realized after the fabrication of the active devices (whereby the fabrication of the active devices is referred to as the front-end-of-line, FEOL), just before the integration of the multilayer chip interconnect stack (whereby the integration is referred to as the back-end-of-line, BEOL). The electrically conductive material of the TSV is typically copper or tungsten metal.

However in the state of the art there are still key issues which need to be resolved in order to integrate these TSV connections in a reliable way with good device performances:
  The use of a metallic connection through the silicon substrate results in large mechanical stress levels in the silicon substrate, causing mobility variations in the silicon (Si) resulting in performance degradation of neighboring devices.
  The presence of a relatively large metallic structure through the bulk of the substrate causes a relatively large electrical capacitance that degrades circuit performance.
  An electrostatic field due to a potential and charging current of the TSV-substrate capacitor during transient operation may affect the device performance of neighboring devices.

Consequently, there is room for improved TSV interconnections and methods for integrating them.

SUMMARY OF THE INVENTION

Through Substrate Via (TSV) interconnects, such as Through Silicon Via interconnects for use in 3D stacked semiconductor devices, are provided that may reduce the negative impact of these 3D-TSV towards neighboring devices. Methods of obtaining such interconnects are also provided.

It is an advantage of the methods and devices of various embodiments that isolating trenches are provided around the TSV interconnect structures, said trenches comprising airgaps, resulting in an improved electrical and/or mechanical behavior. It is an advantage of various embodiments that methods are provided or manufacturing the 3D-TSV semiconductor devices making use of existing processing technology.

Methods and devices of various embodiments significantly reduce the negative impact caused by the relative large 3D-TSV interconnect structures. The negative impact may be mechanical stress created in the substrate around said 3D-TSV structure thereby causing mobility variations in the surrounding substrate and hence resulting in performance degradation of neighboring devices. The negative impact may be caused by inducing a relatively large electrical capacitance that degrades neighboring circuit performance. Furthermore the negative impact caused by the large 3D-TSV structures may be due to the creation of an electrostatic field and potential within the 3D-TSV thereby creating a charging current in the surrounding substrate which may during transient operation affect the device performance of neighboring devices.

It is an advantage of embodiments that at least some of the above negative effects are solved by forming isolating trenches with airgaps during the processing of said 3D-TSV interconnect structure. It is an advantage of embodiments that isolating trenches are provided without adding additional processing steps and making use of processing steps required to fabricate the 3D-TSV.

More particularly, embodiments relate to methods of forming airgaps in isolating structures whereby the structures are situated around a TSV interconnect structure in order to reduce the mechanical stress, the electric field and capacitance effects in the surrounding areas of the large TSV interconnect structure.

The above objective is accomplished by a method and device according to the various embodiments.

The various embodiments relate to a method for providing at least one Through Silicon Via (TSV) interconnect structure surrounded by at least one isolating trench-like structure, said trench-like structure having at least one airgap and said method comprising at least the steps of: providing a substrate having a first main surface, producing simultaneous at least one TSV hole and a trench-like structure, the trench-like structure surrounding said TSV hole and being separated from the TSV hole by remaining substrate material, thereafter, depositing a dielectric liner in order to smoothen the sidewalls of the etched TSV hole and to pinch-off the opening of the trench-like structure at the first main surface of the substrate in order to create at least one airgap in said trench-like structure thus forming a hollow trench-like structure, and then depositing a conductive material in said TSV hole in order to create a TSV interconnect.

The at least one TSV hole may have a diameter, which may also be referred to as width, on the order of 0.1 µm to 30 µm, e.g., between 0.1 µm and 30 µm, e.g. on the order of 2 µm to 20 µm, e.g., between 2 µm and 20 µm. The trench-like structure may have a trench width smaller than 1000 nm. The substrate may be a silicon wafer having active devices on its first main surface material, said active device being produced during a preceding front end of line (FEOL) processing.

The step of producing simultaneous at least one TSV hole and a trench-like structure may be performed using an aspectratio-dependent etching such that the isolating trench-like structure has a trench width of 100-500 nm and the TSV hole has a diameter (width) of between 0.1 μm and 30 μm, e.g., between 2 and 20 μm, and the isolating trench-like structure has a depth approximately ⅕ to ⅔ of the via depth, e.g., between ⅕$^{th}$ and ⅔$^{rd}$ of the via depth.

The aspect-ratio-dependent etching may be a pulsed etching comprising alternating steps of isotropic etching and passivation.

The isotropic etching may be a $SF_6$ based plasma etching step and the passivation step may be a $C_4F_8$ based plasma passivation step.

The isotropic etching step and/or the passivation step may comprise using oxygen and/or inert gases.

The deposited liner may be a tetraethyl orthosilicate (TEOS) liner.

The step of depositing a conductive material in the TSV hole in order to create a TSV interconnect structure may be performed using electrochemical deposition (ECD) techniques or Chemical Vapor deposition (CVD) and wherein the conductive material may be selected from a metal such as Copper (Cu), Nickel (Ni), tungsten (W) or any other metals and/or alloy of metals or selected from alternative conductive materials such as an implanted semiconductor, conductive silicon, conducting polymers, carbon nanotubes.

The method may comprise, after the step of creating a TSV interconnect, a planarization step of the conductive material in order to remove the overburden of conductive material on the horizontal parts of the substrate. The planarization step may be a chemical mechanical planarization (CMP).

The method may comprise, after the step of creating a TSV interconnect, a thermal anneal step in order to initiate grain growth of the metal.

The method may comprise, after the step of creating a TSV interconnect, the step of providing metal contacts onto said TSV interconnect and furthermore several back-end-of-line (BEOL) interconnect layers.

The various embodiments also relate to the use of a method for providing at least one Through Silicon Via (TSV) interconnect structure as described above for the 3D stacking of semiconductor substrates, the use further comprising the step of thinning the backside of the substrate using mechanical operations in order to open the TSV interconnects from the backside and to make a 3D stacking possible.

The TSV interconnect structure may be further provided with a solder ball or bump.

The various embodiments further relate to a substrate comprising at least one interconnect Through Substrate (Si) Via (TSV) structure which is surrounded by at least one isolating trench-like structure comprising an airgap fabricated using the method for providing at least one Through Silicon Via (TSV) and wherein said interconnect TSV structure is a 3D-TSV. The substrate may be a substrate embedded in a 3D stacked semiconductor device.

The various embodiments also relate to a 3D stacked semiconductor device comprising a substrate as described above.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1B illustrates a 3D-TSV having a diameter (width) of around 2 μm thereby responding to further device scaling requirements. Both TSV structures have a liner deposited onto the inner sidewalls of TSV, the liner having a width of around 200 nm in the TSV.

FIG. 2A illustrates a side view and FIG. 2B illustrates a more detailed side view combined with a top view of a portion of the semiconductor substrate.

FIG. 3 illustrates the aspect-ratio-dependent-etch-rate effect (ARDE).

Figure 1A:
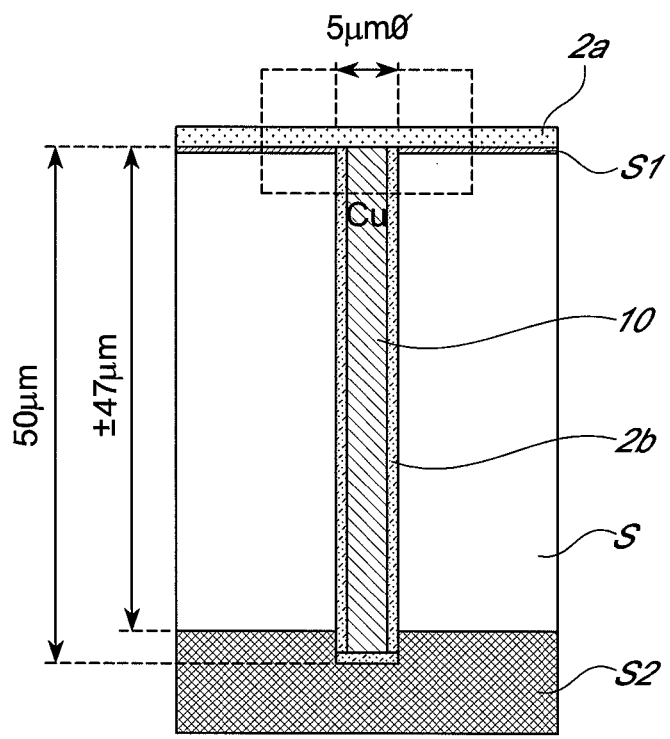
FIGS. 1A and 1B illustrate side views of a state of the art semiconductor substrate having 3D-TSV interconnects, wherein the 3D-TSV have a depth in the substrate of around 50 μm and a diameter (width) around 5 μm (FIG. 1A).

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the various embodiments described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the various embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly it should be appreciated that in the description of exemplary various embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that various embodiments may be practiced without these specific details. In other instances, well-known methods, structures, and techniques have not been shown in detail in order not to obscure an understanding of this description.

Where in embodiments and/or claims reference is made to a through silicon via, reference is not only made to a via through a silicon substrate, but more generally through a substrate, such as for example a semiconductor substrate comprising semiconductor active devices. Where in embodiments and/or claims reference is made to the substrate, such a substrate thus may be a silicon substrate but also may be any other suitable substrate, such as for example a semiconductor substrate comprising semiconductor active devices.

Where reference is made in embodiments to isolating "trench-like structure" this may refer to a structure with any geometrical shape having a specific trench width $W_G$, sometimes also referred to as the thickness, the diameter or the width of the trench-like structure that is surrounding a TSV structure. The trench-like structure may be a closed loop structure. Examples of suitable shapes for the trench-like structure are a circular ring, polygonal ring, square ring, or the like. In some embodiments, the air gap may itself have a ring-like shape for surrounding the interconnect structure. In between said "trench-like structure" and the TSV structure there is substrate material. In embodiments the isolating trench-like structure is separated from the TSV by remaining substrate (e.g., Si) material having at least a critical thickness, also referred to as diameter or width of the remaining substrate material, which is on the order of from one μm to 2 times the via diameter, with ½ the via diameter preferred in certain embodiments.

Where in embodiments reference is made to a pulsed etching it refers to a process in which an etching step is alternated with a deposition step and this is repeated to achieve nearly vertical structures. It is also referred to as the "The Bosch process." The plasma contains some ions, which attack the wafer from a nearly vertical direction. For silicon, this pulsed etching preferably uses sulfur hexafluoride source gas [$SF_6$], while for the deposition of a chemically inert passivation layer, preferably a $C_4F_8$ source gas is used and each pulsed phase preferably lasts for several seconds. The passivation layer protects the entire substrate from further chemical attack and prevents further (lateral) etching. However, during the etching phase, the directional ions that bombard the substrate attack the passivation layer at the bottom of the trench (but not along the sides. The etch/deposition steps are repeated many times over, resulting in a large number of very small isotropic etch steps taking place only at the bottom of the etched pits. To etch through a 0.5 mm silicon wafer, for example, 100-1000 etch/deposit steps are needed. Typically this etching process results in sidewalls having a scalloped surface.

The various embodiments relate to a semiconductor device and a method for making said device, the semiconductor device comprising at least one 3D-TSV interconnect and isolating trench-like structure, said isolating trench-like structure comprising at least one airgap. Said 3D-TSV interconnect is preferably a pillar made of conductive material which can be connected to the interconnect structures of for example another semiconductor substrate or another semiconductor device and/or another level of interconnect structures within the same semiconductor device.

The method of the various embodiments for making the 3D-TSV interconnect is based on the so-called "via-middle" approach, wherein the TSV is realized after the fabrication of the active devices (the front-end-of-line, FEOL), just before the integration of the multilayer chip interconnect stack (the back-end-of-line, BEOL). The electrically conductive material of the TSV is typically copper or tungsten metal.

According to a first aspect, a substrate, preferably a semiconductor substrate comprising semiconductor active devices, is provided which comprises at least an interconnect Through Substrate (Si) Via (TSV) structure which is surrounded by at least one isolating trench-like structure comprising an airgap. The interconnect structure is preferably a 3D-TSV in the form of a conductive pillar. The at least one isolating trench-like structure comprises at least an airgap and a sealing which pinches off the airgap. The trench-like structure typically is separated from the interconnect structure by a spacer material being made of the original semiconductor substrate material. According to embodiments, the substrate is made using a method as will be described in the further aspect.

By way of illustration, embodiments not being limited thereto, standard and optional features now will be described with reference to FIG. 2A and FIG. 2B. For reasons of comparison, first reference is made to FIG. 1A and FIG. 1B, illustrating a 3D-TSV interconnect structure having no airgap trench as known from prior art.

Figure 1B:
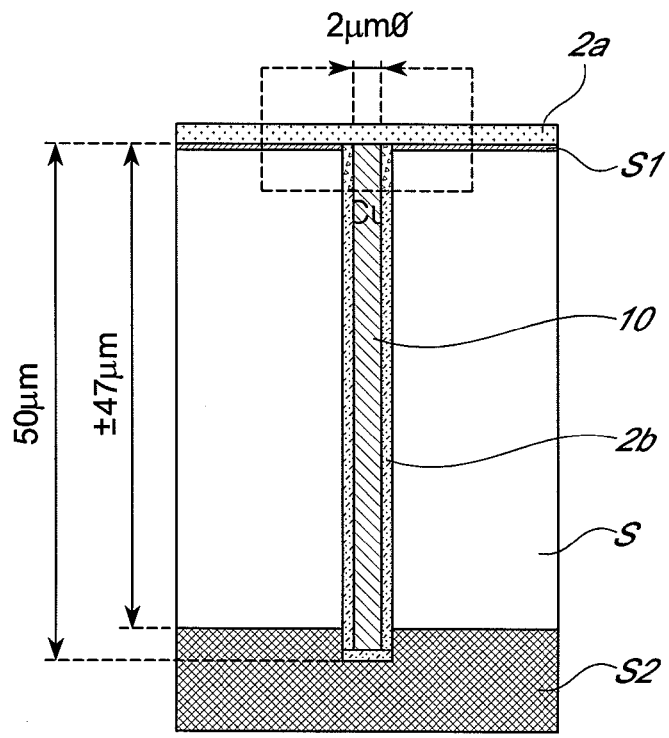

FIG. 1A and FIG. 1B illustrate side views of a state of a state of the art semiconductor substrate having 3D-TSV interconnects 10, said 3D-TSV having a depth in the substrate S of around 50 µm and a diameter around 5 µm (FIG. 1A). FIG. 1B illustrates a 3D-TSV 10 having a diameter of around 2 µm thereby responding to further device scaling requirements. Both TSV structures 10 have a liner 2b deposited onto the inner sidewalls of TSV, said liner 2b having a width of around 200 nm in said TSV 10.

Figure 2A:
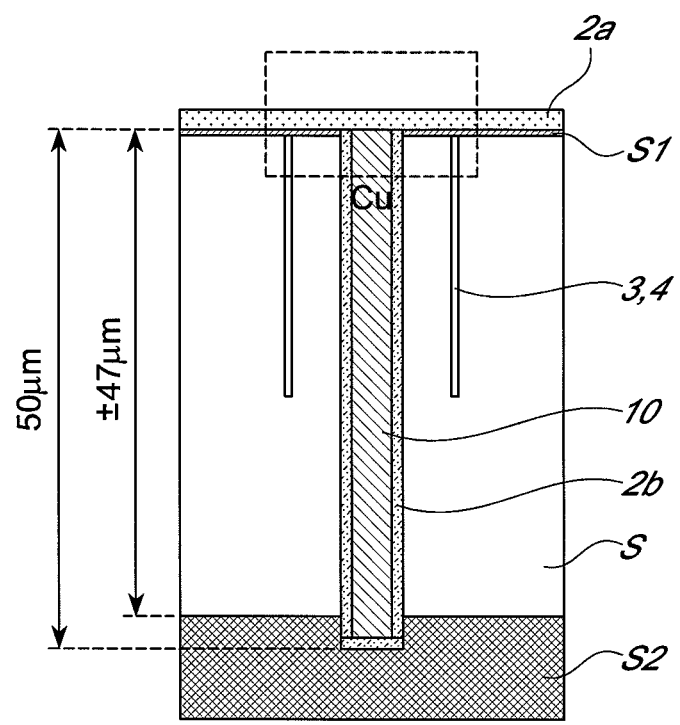
FIGS. 2A and 2B illustrate side views of a semiconductor substrate having a 3D-TSV according to FIG. 1 and further comprising isolating trench-like structures having at least one airgap according to various embodiments.
Figure 2B:
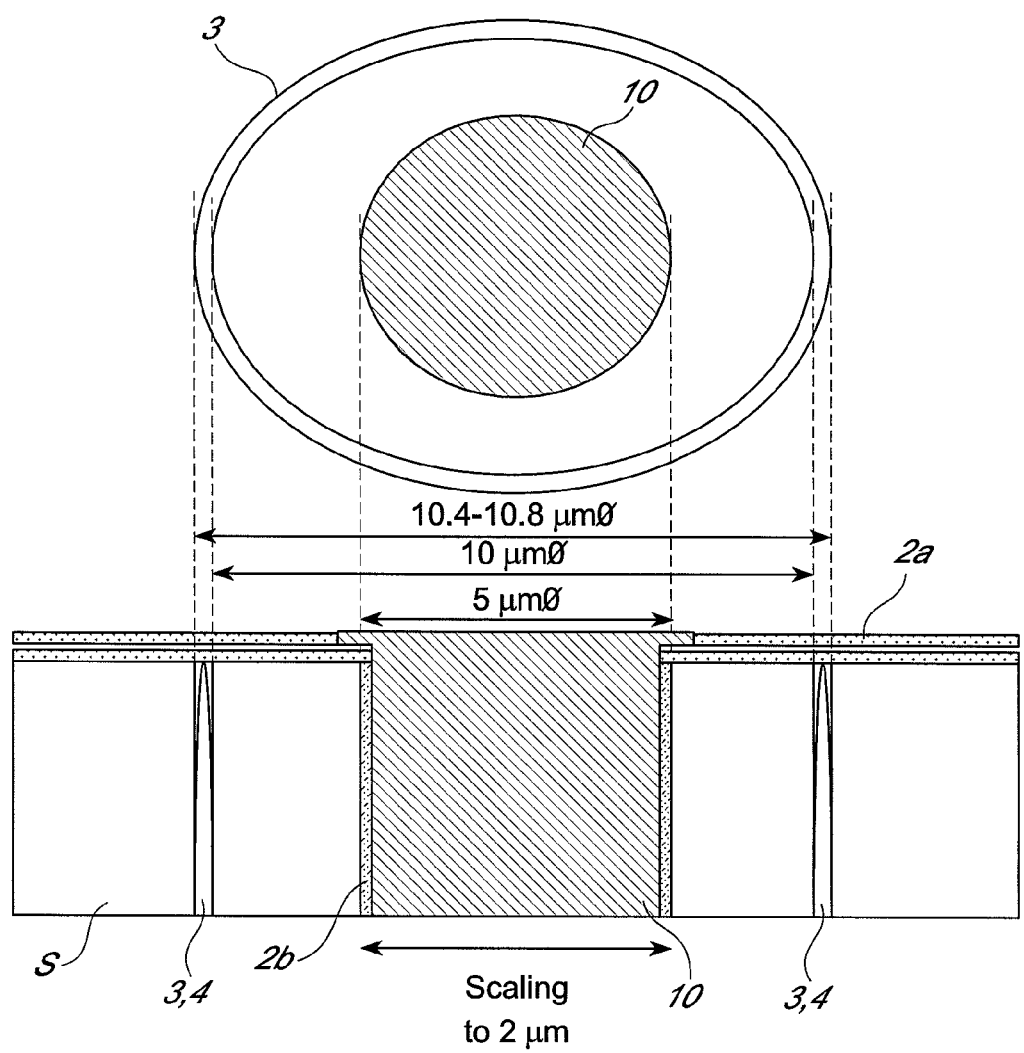

Turning now to FIG. 2A and FIG. 2B illustrating side views of a particular example of an embodiment, wherein the semiconductor substrate S has a 3D-TSV 10. The semiconductor substrate S comprises a 3D-TSV 10 in the present example having a depth in the substrate S of around 50 µm and a diameter (width) around 2 µm and further comprises isolating trench-like structures 3 having at least one airgap 4. The trench-like structure 3 thus is a hollow trench-like structure comprising at least one airgap 4. A liner 2a may be deposited onto the substrate S and on the inner sidewalls 2b of TSV. In the present example, the liner 2b has a thickness of around 200 nm on the inner sidewalls of said TSV, although embodiments are not limited thereto. The liner further may pinch of the isolating trench-like structures 3 thereby creating an airgap 4 in the trench-like structures. FIG. 2A illustrates a side view and FIG. 2B illustrates a more detailed side view combined with a top view. FIG. 2A further illustrates the portion of the (backside) substrate S2 to be removed in order to open the TSV 10 structure when the device is finalized.

According to various embodiments, the at least one isolating trench-like structure is etched at the same time (simultaneous) as the interconnect TSV structure and hence requiring no additional processing. Due to aspect-ratio-dependent etching it is possible to etch for example the isolating trench-like structure having a diameter on the order of 200-500 nm at the same time of the interconnect TSV structure having a diameter on the order of from 0.1 µm to 20 µm, e.g., between 0.1 µm and 20 µm, e.g., between 2 µm and 20 µm, e.g., between 2 µm and 10 µm. In general, the isolating trench-like structure has a depth which is about ⅕ to ⅔ of the via depth. A state of the art anisotropic Bosch etch process may be used to perform said simultaneous etching.

According to various embodiments, the airgap in said at least one isolating trench-like structure is formed through depositing a liner onto the substrate whereby said liner pinches off the trench-like structure, thereby forming at least one airgap in said trench-like structure. The pinch-off is preferably realized during the deposition of a liner within the TSV structure and hence requiring almost no additional processing. A liner deposition within the TSV structure is preferred to realize a smoothening of the sidewalls (to reduce the scalloped surface) after etching the TSV structure.

Figure 8:
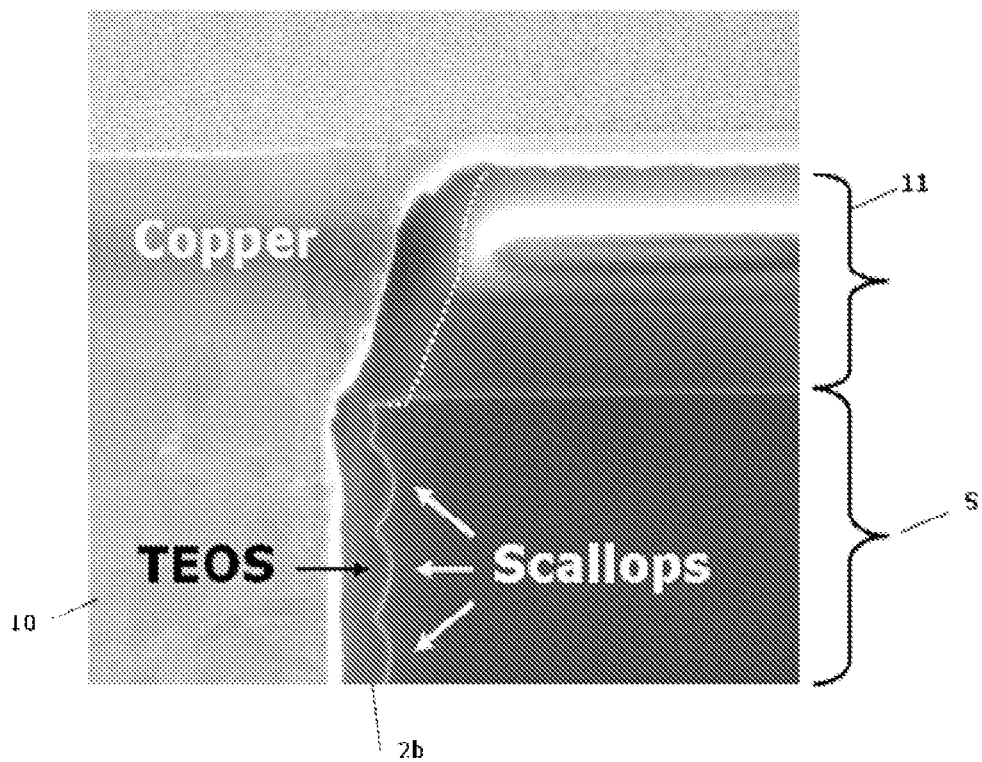
FIG. 8 is a SEM picture illustrating the TSV interconnect structure filled with copper and having a SA-CVD deposited TEOS liner according to a particular embodiment. The TEOS liner clearly smoothes the scalloped surface of the inner sidewalls of the TSV hole.

According to various embodiments, the liner material used to smooth the sidewalls of the TSV structure and at the same time pinching off the airgap in the trench like structure can be made of a liner material selected from an oxide and/or nitride and/or polymer such as CVD oxide, CVD nitride, SA-CVD TEOS oxide, plasma enhanced CVD oxide. FIG. 8 is a SEM picture illustrating the TSV interconnect structure 10 filled with copper and having a SA-CVD deposited TEOS liner 2b. The TEOS liner is clearly smoothing the scalloped surface of the inner sidewalls of the TSV 10.

According to various embodiments, the isolating trench-like structure is narrow such that during TSV liner deposition (typically oxide or nitride) forms an airgap in the trench due to the pinch-off of the liner deposited on the field area. To realize the pinch-off, the at least one trench-like structure typically has a diameter (width) smaller than 2 times the average thickness of the deposited liner on the Si-sidewall near the top of the via (which is typically 40% less than the thickness of the deposited liner on the field area). This means that for a deposited liner on the TSV sidewall having a thickness of, e.g., 200 nm, the average diameter of the trench-like structure has to be smaller than 400 nm. The at least one trench-like structure typically has a diameter around 200-500 nm and a liner deposition of, e.g., 200 to 300 nm thickness on the TSV sidewalls is sufficient to pinch-off the trench surrounding the TSV.

According to various embodiments, the isolating trench-like structure may have any closed form shape, such as a polygon, circle, or oval, with the TSV structure situated within said closed form trench separated by a minimum amount of substrate material. Mechanical stresses in the substrate material that are caused by the different materials used inside the TSV will be concentrated in this narrow silicon ring-like structure around the TSV structure. The diameter may be optimized in order to minimize and to avoid loss in TSV density over the whole device substrate. The separation between the outside of the TSV and inner dimension of the air-gap trench surrounding the TSV is in the range of 1 µm to one or two times the TSV diameter.

Figure 4:
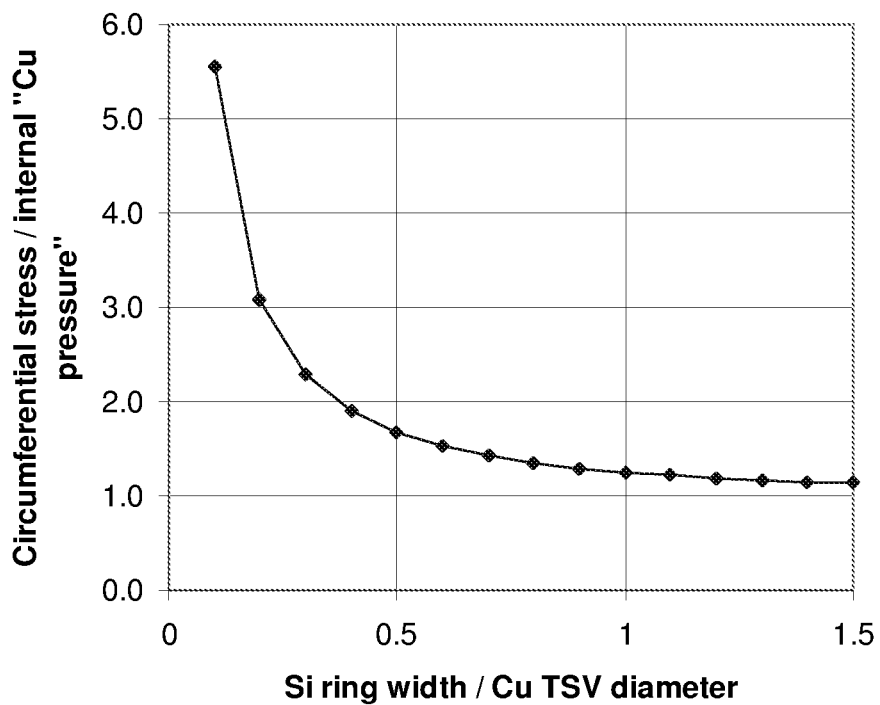
FIG. 4 illustrates the stress in the (Si) substrate surrounding the TSV, relative to the stress in the TSV, as a function of the diameter (width) of the substrate (Si) ring in between the isolating trenches and the TSV, illustrating advantages of embodiments.
Figure 5:
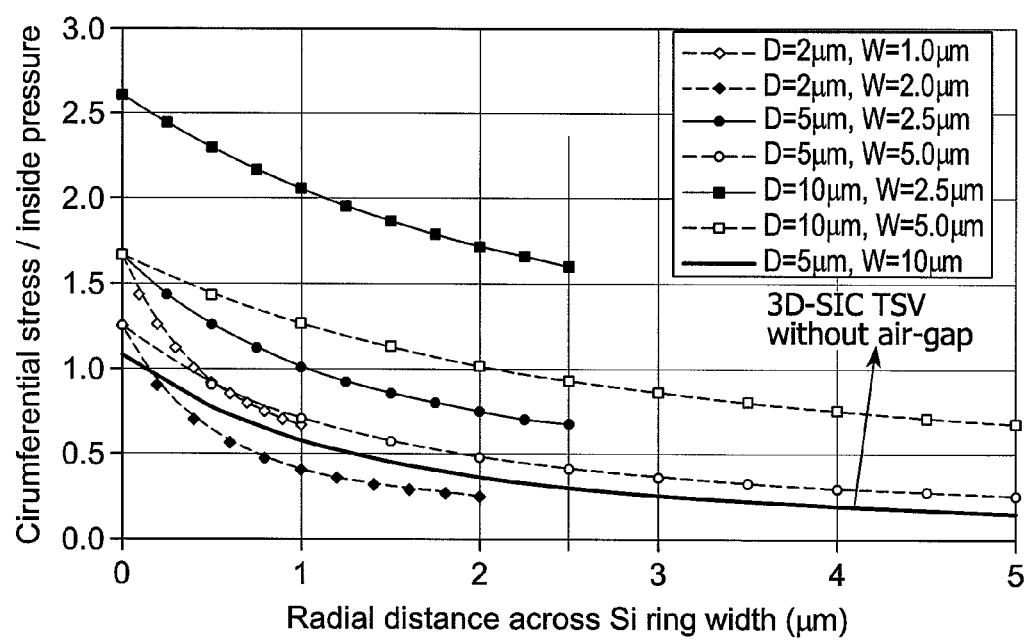
FIG. 5 illustrates a first order analytical model illustrating the stress in the substrate (Si) ring around the TSV due to stress in TSV, illustrating advantages of embodiments.

High mechanical stress in the substrate surrounding the TSV may result in mobility changes in the channels of surrounding (MOSFET) devices thereby causing cracks in the substrate between closely spaced TSVs which may be avoided be concentrating and capturing the stress in said substrate material (ring) in between the isolating trench-like structure and the TSV. An isolating trench-like structure comprising an airgap thereby significantly helps to isolate the stress. Furthermore high mechanical stress in TSV (copper) may cause TSV (Cu)-"pumping" and thereby cause damage to the low-k dielectric in the BEOL. FIG. 4 illustrates the stress concentration in the (Si) substrate surrounding the TSV as a function of the diameter of the substrate (Si) ring in between the isolating trenches and the TSV. FIG. 5 illustrates a first order analytical model illustrating the stress in the substrate (Si) ring around the TSV due to stress in TSV for different TSV diameters and diameter of the Si ring between the TSV and the air-gap.

According to various embodiments, the material between the trench-like structure and the TSV may have a thickness Ws, which may preferably be larger than 100 nm, e.g. at least 0.5 μm, e.g. at least 1 μm, e.g. at least 1.5 μm, e.g. at least 2 μm, e.g. at least 2.5 μm, e.g. at least 3 μm, e.g. at least 4 μm, e.g. at least 5 μm or e.g. at least 10 μm. The thickness of this material may be selected such that its strength is sufficient to support the thermo-mechanical forces resulting from the stresses in the inner TSV metallization during thermal excursions. Of particular importance may be the circumferential or "hoop"-stress. This stress is a function of the TSV conductive inner pillar size and the width of the surrounding ring of material. This requirement may result in a minimum thickness of the ring surrounding the TSV conductive inner pillar of 2 to 5 μm in the case of Cu TSV in a Si substrate, depending on the via diameter used.

According to various embodiments, the TSV structure may have a diameter/width between 0.1 and 30 μm. According to particular embodiments the TSV may have an average diameter/width in the range of 0.5 μm to 30 μm, or e.g., 0.5 μm to 20 μm, or e.g., 0.5 μm to 5 μm, or e.g., 1 μm to 30 μm, or e.g., 1 μm to 20 μm, or e.g., 2 μm to 5 μm, more particular the TSV may have an average diameter of around 2 μm.

According to various embodiments, the depth of the trench-like structure may be significantly less than the depth of the TSV structure, the depth of the trench-like structure may be only 5 to 10 μm.

According to various embodiments, the TSV structure may have a depth around 50 μm in the substrate, which results after thinning the substrate in order to expose the conductive part of the TSV in a depth of around 47 μm.

According to various embodiments, the TSV structure may be made of a material selected from copper (Cu), aluminum (Al), tungsten (W), or any other metals used in the field. The conductive material can also be an alloy, an implanted semiconductor, conductive silicon, conducting polymers. Alternatively a metal paste, e.g. Cu paste, can be applied. Also combinations of above mentioned materials can be used. The step of depositing a conductive material possibly creates an interconnect with an external contact. This step can comprise various sub-steps. Extra layers underlying the conductive material or intermediate layers can be used. This can be for example improve the filling of the holes, improve adhesion of the conductive material, further reduce the stress within the TSV, prevent inter-diffusion of materials, or the like.

In particular embodiments, the TSV structure may be made of conductive material, and further comprise a barrier layer and/or a seed layer which is deposited before filling the TSV structure with conductive material e.g. by electroplating. Said seed layer may cover the whole surface of the side walls and bottom wall of the TSV structure. Said barrier layer is preferably made of a material selected from Ta, Ti, TaN, TiN, RuTa, Mn, and combinations thereof and is deposited by state of the art deposition techniques such as PVD and CVD and combinations thereof. A seed layer is preferably made of a material selected from Cu, Ni, Co, W, Mn and may be applied for instance by Chemical Vapor Deposition (CVD), Physical Vapor Deposition (sputtering) (PVD), Atomic Layer Deposition (ALD), Electro Chemical Deposition (ECD), as well as by any other method known in the art.

It is also possible that more than one electrical interconnect TSV structure (conductive pillar) is formed within a single surrounding trench-like structure. This means that parallel TSV are formed within the same trench-like (ring) structure.

In a second aspect, a method for the fabrication of at least one Through Substrate Via (TSV) interconnect with surrounding isolating trench like structure is provided, whereby the trench-like structures comprise at least one airgap to further improve its insulating properties. Said method is characterized and differentiated towards state of the art methods in the fact that the isolating trench-like structures are fabricated at the same time as the fabrication of the TSV holes thereby reducing the number of processing steps significantly. The method is further differentiated by the formation of airgaps in said isolating trench-like structures. No process steps are added to the process flow to create and seal the airgap trenches. No additional masks are required. According to embodiments, the method comprises providing a substrate having a first main surface and producing simultaneous at least one TSV hole having a diameter on the order of 0.1 μm to 30 μm, e.g., between 0.1 μm and 30 μm, e.g., on the order of 2 μm to 20 μm, e.g., between 2 μm and 20 μm, and a trench-like structure having a trench width smaller than 1000 nm, the trench-like structure surrounding the TSV hole and being separated from the TSV hole by remaining substrate material. The method also comprises, after formation of the TSV hole and the trench-like structure, depositing a dielectric liner in order to smooth the sidewalls of the etched TSV hole and to pinch-off the opening of the trench-like structure at the first main surface of the substrate in order to create a hollow trench-like structure with at least one airgap in said trench-like structure. The method also comprises depositing a conductive material in said TSV hole in order to create a TSV interconnect.

By way of illustration, embodiments not being limited thereto, standard and optional steps of a method as described above will further be discussed, with reference to an exemplary method according to an embodiment. FIGS. 10A-10H illustrate different processing steps according to various embodiments, to fabricate a Through Silicon Via (TSV) interconnect based on the via middle approach whereby said TSV interconnects are surrounded by isolating trenches with airgaps.

According to embodiments, the method comprises obtaining a substrate. The substrate in the present example is a silicon wafer having active devices on its first main surface material, the active device being produced during the preceding FEOL processing. After completion of the TSV interconnect BEOL processing is performed in order to create BEOL interconnects.

According to embodiments, the step of producing at the same time (simultaneous) at least one a TSV hole and a trench-like structure is performed using an aspect-ratio-dependent etching such that it is possible to etch the isolating trench-like structure having a diameter (width) on the order of 100-500 nm at the same time of the TSV hole having a diameter (width) on the order of 0.1 μm to 30 μm, e.g., between 0.1 μm and 30 μm, e.g., on the order of 2 μm to 20 μm, e.g., between 2 μm and 20 μm. In general, the isolating trench-like structure has a depth which is about ⅕ to ⅔ of the via depth. A state of the art anisotropic Bosch etch process may be used to perform said simultaneous etching.

Figure 3:
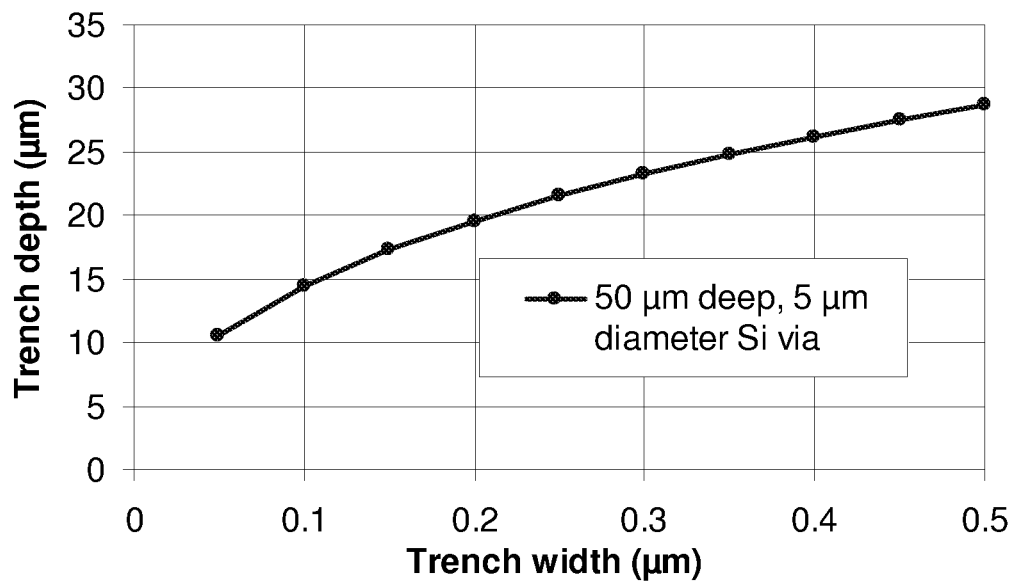
FIG. 3 illustrates the trench depth in function of the trench diameter (width) when performing the Bosch etch process in order to etch simultaneously a 50 μm deep and 5 μm wide TSV according to various embodiments.

FIG. 3 illustrates the aspect-ratio-dependent-etch-rate effect (ARDE), the Figure illustrates the etched trench depth as a function of the trench diameter (width) when simultaneously a 50 µm deep TSV hole having a diameter (width) of around 5 µm for a typical Bosch type etch process (tool dependent).

Figure 9:
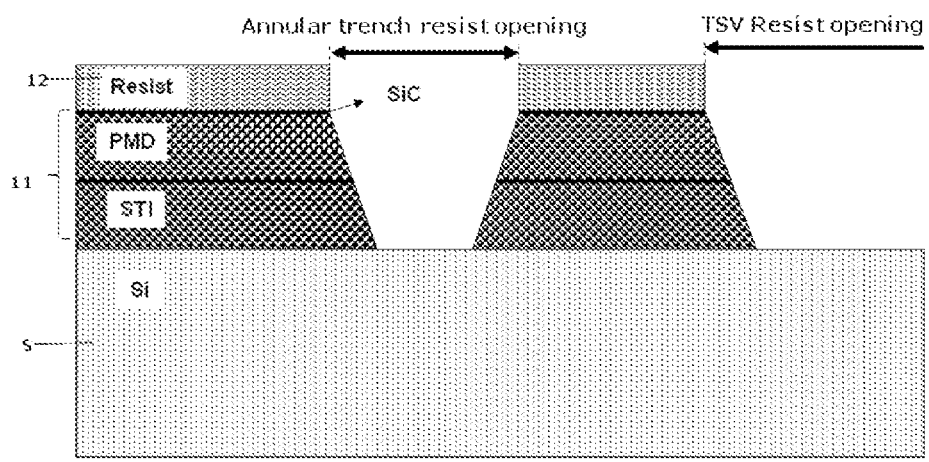
FIG. 9 illustrates a detailed view of the substrate with a photoresist, PMD and STI layer after patterning in order to define the TSV hole (to be etched) and the isolating trenches or ring (to be etched) according to a particular embodiment.
Figure 10A:
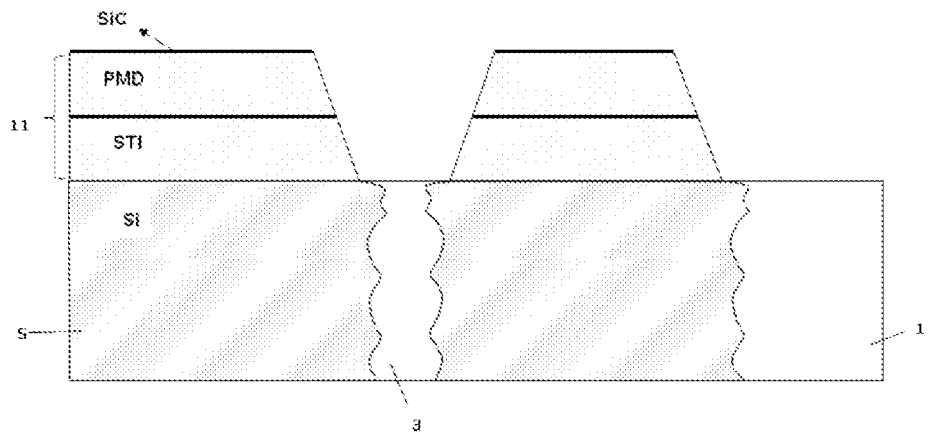
FIGS. 10A-10H illustrate different processing steps according to a particular embodiment to fabricate a Through Silicon Via (TSV) interconnect based on the via middle approach whereby said TSV interconnects are surrounded by isolating trenches with airgaps.

FIG. 9 and FIG. 10A illustrate a detailed view of the substrate S with a photoresist 12, PMD and STI layer(s) 11 after patterning in order to define the TSV hole (to be etched) and the isolating trenches or ring (to be etched).

According to embodiments, the trench-like structure is a trench-like ring structure having a diameter (width) below 100 nm to 500 nm. The outer diameter of the trench-like ring structure may be on the order of 10 µm to 15 µm, for example 10.4 µm to 10.8 µm. The inner diameter of the trench-like ring structure may be on the order of 10 µm.

According to embodiments, the TSV hole is having a diameter (width) on the order of 0.1 µm to 30 µm, e.g., between 0.1 µm and 30 µm, e.g., on the order of 2 µm to 20 µm, e.g., between 2 µm and 20 µm. The TSV hole (interconnect structure) may have a diameter (width) smaller than 10 µm, or smaller than 7 µm, or smaller than 6 µm or below 5 µm or below 4 µm. According to particular embodiments said TSV hole may have an average diameter (width) in the range 0.1 µm up to 5 µm, e.g. in the range 2 µm to 5 µm, more particular said TSV hole has an average diameter (width) of around 2 µm.

According to embodiments, the distance between the TSV and the trench-like structure comprising an airgap is such that it allows for a sufficiently low stress layer in this Si sidewall (Stress is more concentrated when using an airgap), typically this will be a diameter (width) between 1 µm and 1 or 2 times the via diameter, most typically around half of the via diameter.

Figures 6A, 6B:
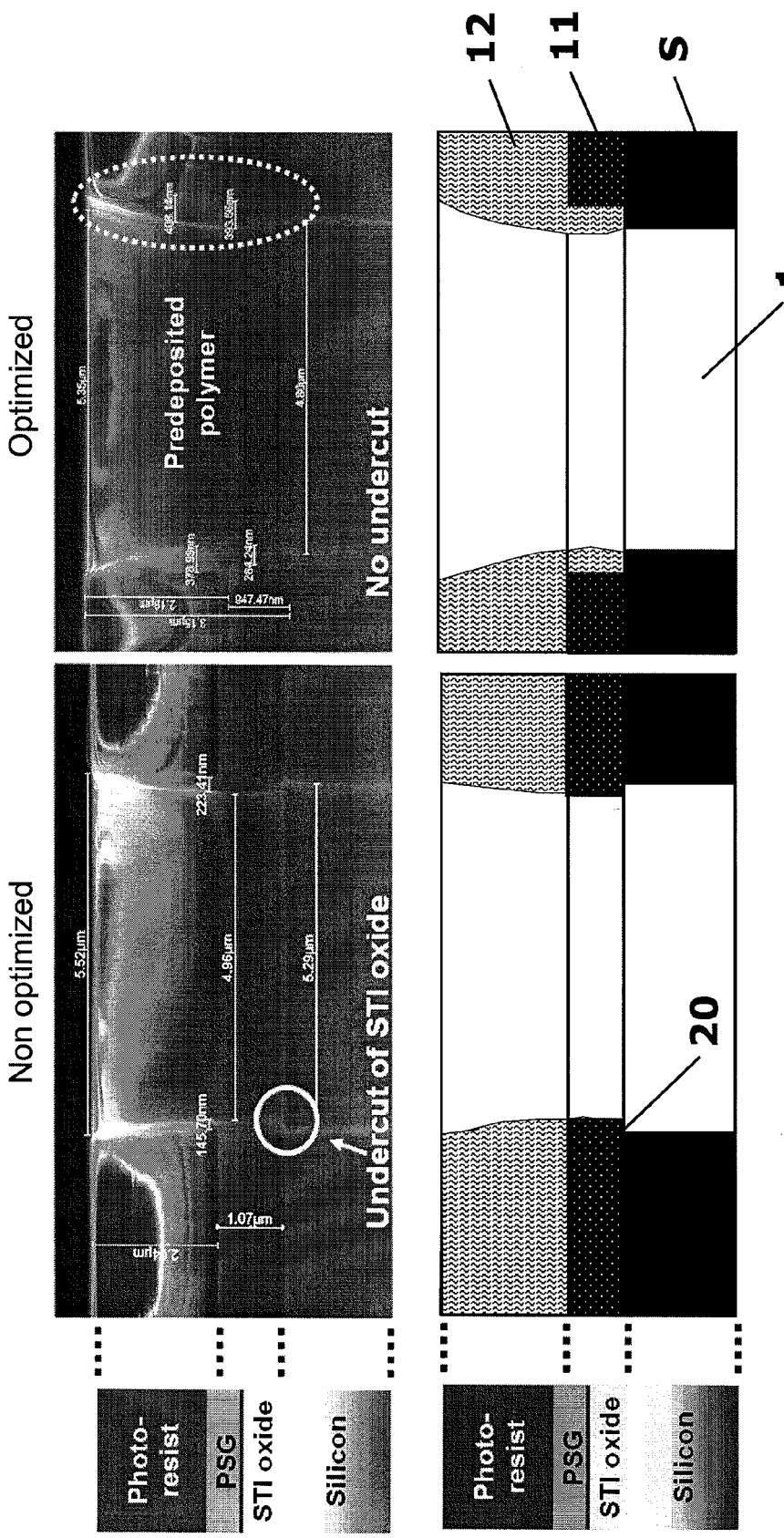
FIGS. 6A and 6B illustrate the TSV after performing a standard deep via etch process (FIG. 6A) and after applying an optimized deep via etch process to obtain undercut free etch with limited scallops (FIG. 6B), illustrating advantages of embodiments.

According to embodiments, the step of providing TSV holes (interconnect structures) in the first main surface of the substrate may be performed using an etch process which is optimized to obtain undercut free etch with limited scallops on the sidewalls during etching. This may be a pulsed etching technique comprising alternating steps of isotropic etching and passivation (Bosch process). Said alternating etching—passivation process is preferably performed using an $SF_6$ based plasma etching step alternated with a $C_4F_8$ based plasma passivation step, optionally further comprising oxygen and/or inert gases in either or both steps. FIG. 6 illustrates the TSV hole 1 with an undercut 20 after performing a standard deep via etch process (FIG. 6A) and after applying an optimized deep via etch process to obtain undercut free etch with limited scallops (FIG. 6B).

Figure 10B:
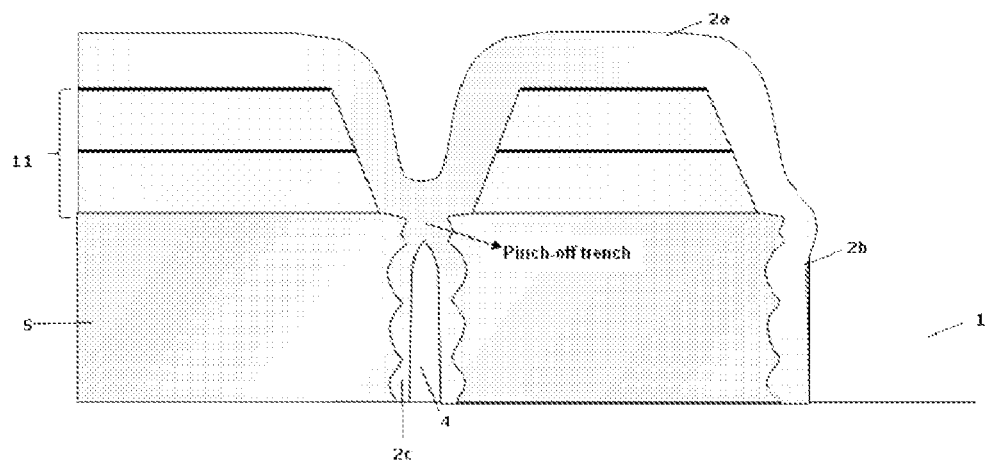

FIG. 10B illustrates a detailed view of the substrate S with a patterned photoresist 12, PMD and STI layer(s) 11 and a liner 2a deposited in the TSV hole and isolating trenches. The liner is deposited on the horizontal parts of the substrate 2a and onto the sidewalls of the TSV hole 2b and within the isolating trenches 2c. FIG. 10B clearly illustrates the closure of the opening (top) of the isolating trenches 3 thereby pinching-off the trench and forming an airgap 4 within said trench.

Figure 7A:
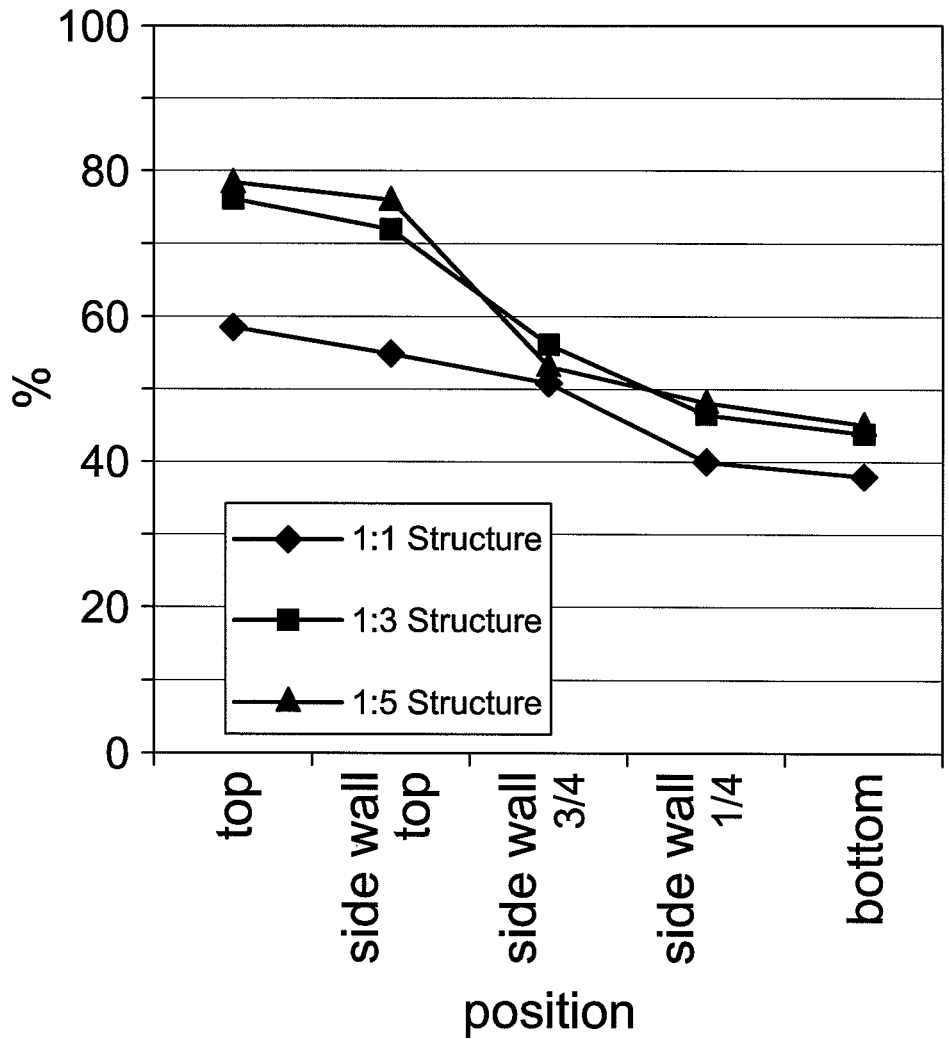
FIG. 7A illustrates the thickness of a TEOS liner using a SA-CVD O3-TEOS process (at 400° C.) on a substrate (300 mm wafer) having TSV of 5 μm diameter (width) and having an aspect ratio 1:1, 3:1 and 5:1, illustrating features of particular embodiments.
Figure 7B:
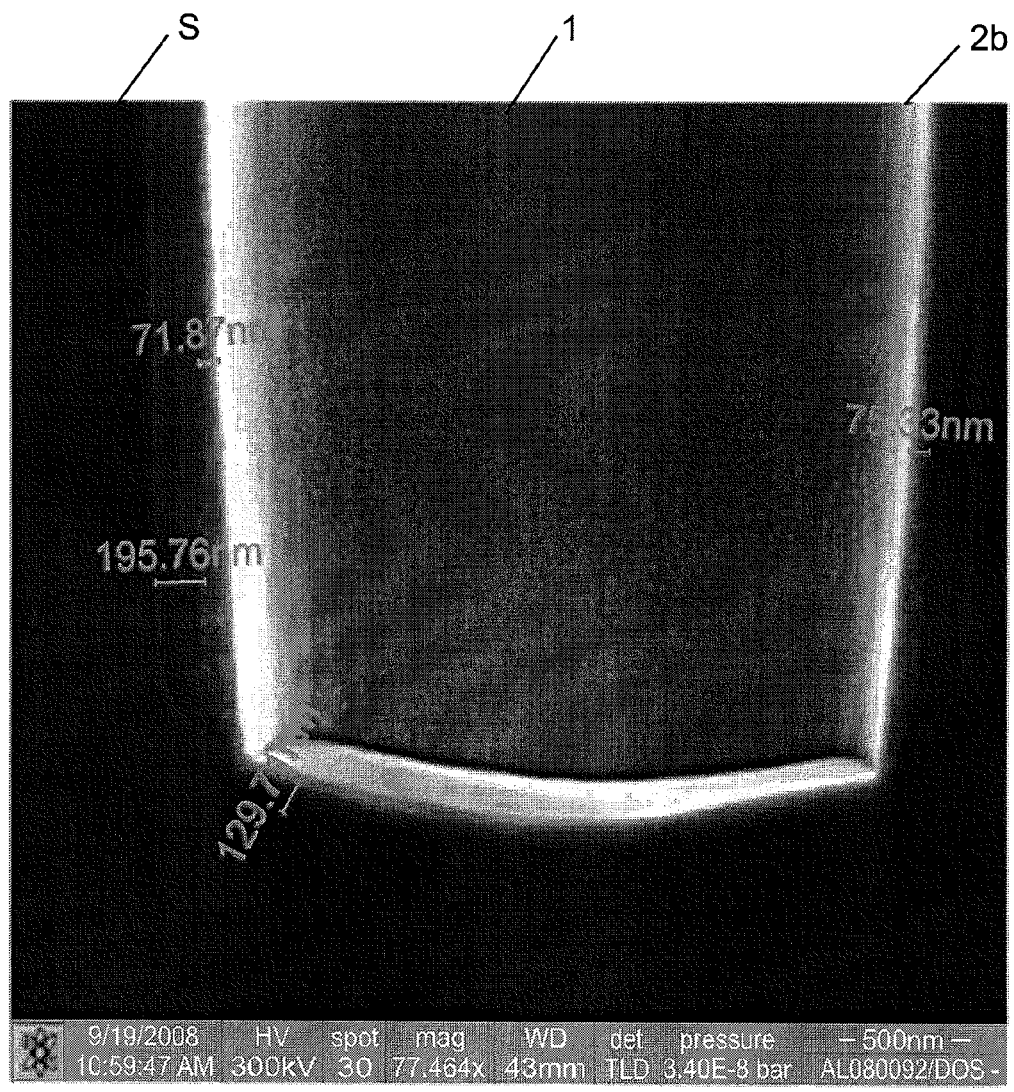
FIG. 7B illustrates a SEM picture of the bottom and sidewall of a TSV having an aspect ratio 10:1, illustrating features of a particular embodiment. For a 200 nm thick liner on the bottom sidewall, a 500 nm thick layer is deposited on the top surface of the substrate (wafer).

According to embodiments, the thickness of the deposited liner is such that it pinches off the trench-like (ring) structure at the surface of the substrate such that an airgap is created in the center of said structure. The thickness of the liner is much thicker on the horizontal parts compared to the thickness on the vertical parts (sidewalls of the TSV hole). This is illustrated in FIG. 7A which shows the thickness of a TEOS liner using a SA-CVD O3-TEOS process (at 400° C.) on a substrate (300 mm wafer) having TSV of 5 µm diameter (width) and having an aspect ratio of 1:1, 3:1 and 5:1. FIG. 7B illustrates a SEM picture of the bottom and sidewall of a TSV 1 having an aspect ratio 10:1. For a 200 nm thick liner on the bottom sidewall 2b, a 500 nm thick layer 2a is deposited on the top surface of the substrate (wafer).

Figure 10C:
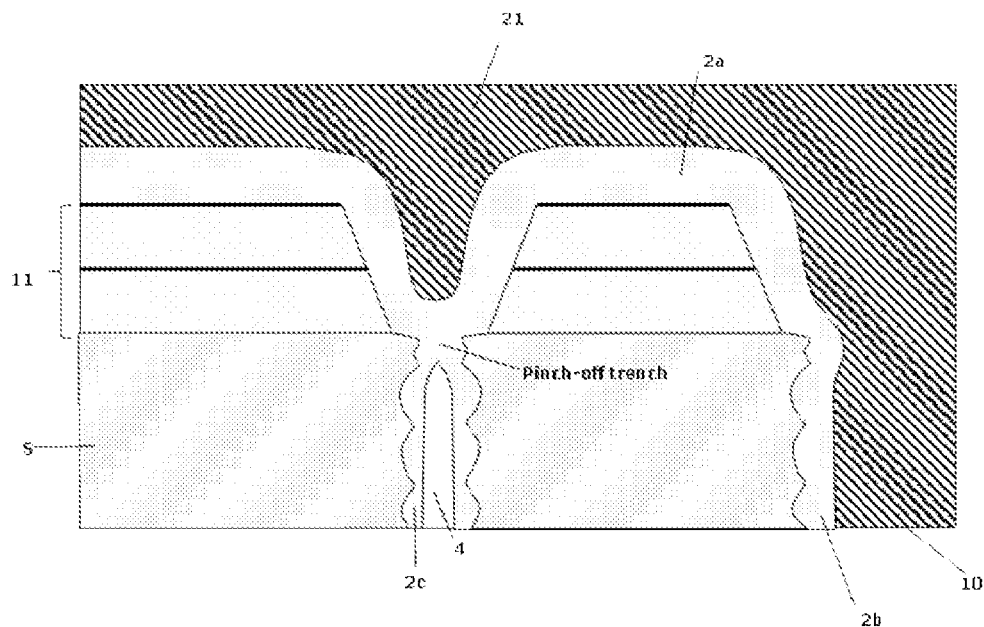

According to embodiments, the step of depositing a conductive material in said TSV hole in order to create a TSV interconnect structure is such that said TSV hole is at least partly filled with a conductive material thereby creating an electrical interconnect structure suitable for forming an electrical path from the bottom surface of the hole up until the surface of the substrate. FIG. 10C illustrates the deposition of barrier material and conductive material 21 onto the substrate S thereby filling the TSV hole with conductive material in order to create a TSV interconnect 10.

According to various embodiments, the step of at least partly filling the TSV hole with a conductive material is performed using electrochemical deposition (ECD) techniques or alternatively Chemical Vapor deposition (CVD). Said conductive material may be a metal such as Copper (Cu), Nickel (Ni), tungsten (W) or any other metals and/or alloy of metals. Also alternative conductive materials may be used such as an implanted semiconductor, conductive silicon, conducting polymers, carbon nanotubes. Alternatively a metal paste consisting of metallic particles and organic binders, e.g. Ag paste, can be applied. Alternatively Carbon nanotubes (CNT) and combination of CNT and Cu can be applied.

Figure 10D:
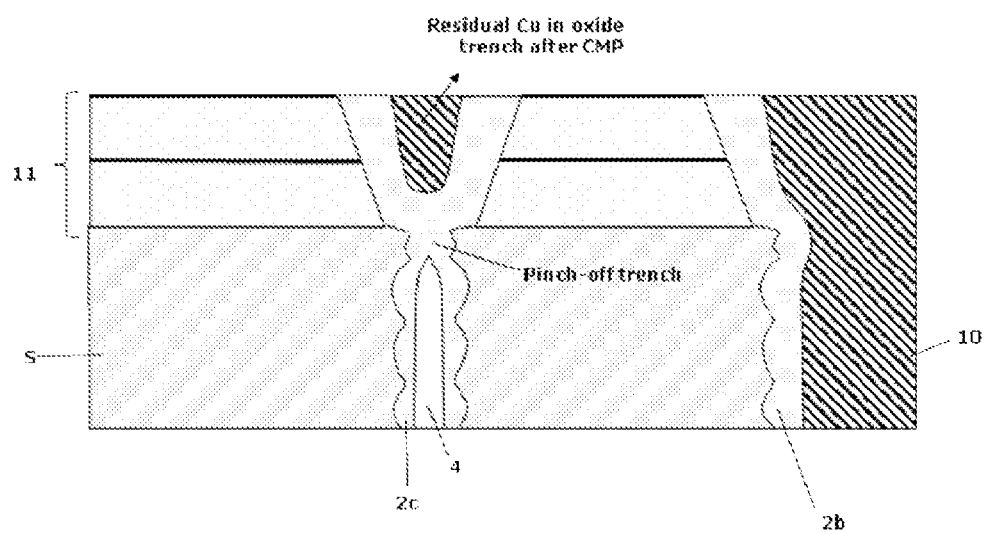
Figure 10E:
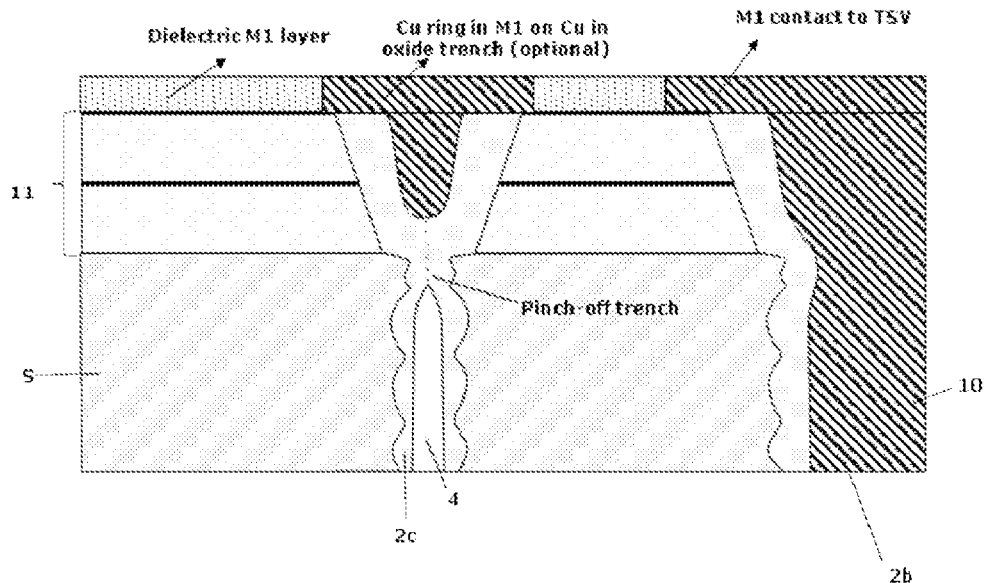
Figure 10F:
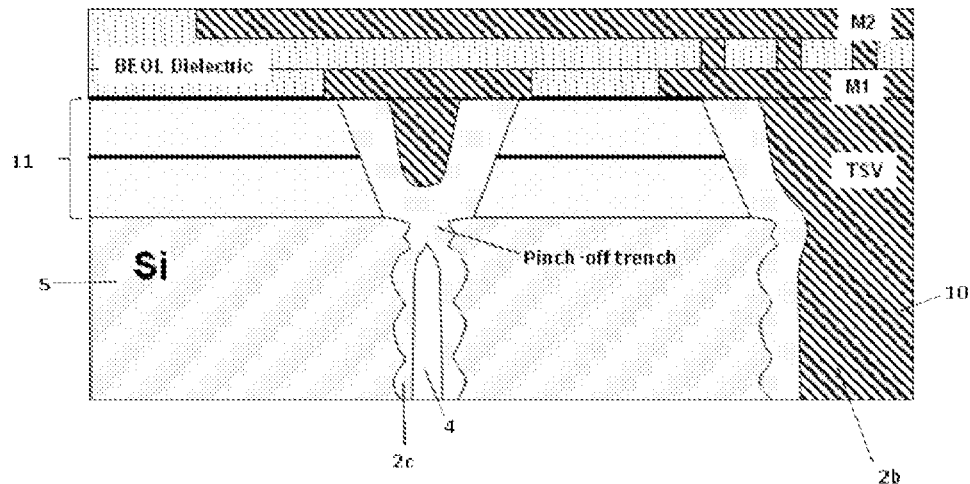

FIG. 10D illustrates the step of performing a planarization of the conductive material in order to remove the overburden of conductive material 20 on the horizontal parts. Said planarization may be performed using Chemical Mechanical Planarization (CMP). A residual part of conductive material may be left above the isolating trenches After performing the TSV processing steps the device may then be further finalized by providing metal contacts onto said TSV interconnect and furthermore several BEOL interconnect layers. FIG. 10E indicates the metal contacts and dielectric layer surrounding said metal contact. FIG. 10F illustrates further BEOL layers for the first (M1) and second metal (M2) layers in combination with Dielectric layers.

Figure 10G:
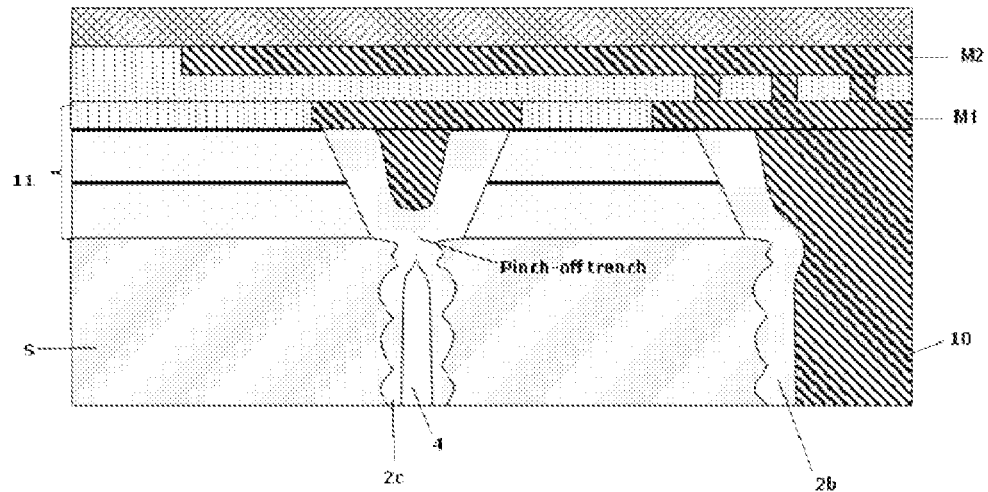
Figure 10H:
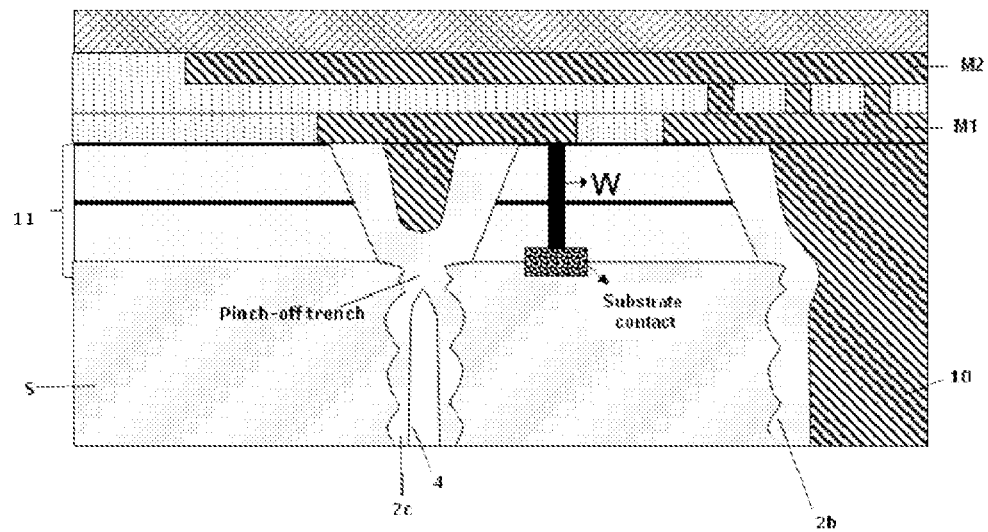

FIG. 10G illustrates the passivation step after finalizing the BEOL processing. FIG. 10H illustrates the structure connected to the substrate by a tungsten (W) contact. Finally the substrate may be thinned on the backside in order to open the TSV interconnects from the backside of the substrate in order to make a 3D stacking possible. Said TSV interconnect structure may therefore be further provided with a solder ball or bump. Thinning of the substrate may be performed down to a substrate thickness of 50 µm-100 µm. The thinning may be performed by for instance mechanical operations such as grinding or other state of the art techniques. According to alternative embodiments, the thinning may comprise chemically thinning, e.g., by dry etching or plasma etching the substrate 1 from the backside, the thinning being halted when the interconnect structure 5 is reached. The chemical thinning, e.g. plasma etching, may not stop at the level where the conductive structure 10 is reached, but may continue above that level (thus slightly over etching the substrate S e.g., silicon wafer). The interconnect structure (the conducting material 10 or the combined conductive material and dielectric will then stick out of the etched-back surface, which is advantageous for the addition of a solder volume such as a solder ball or bump. A solder volume as for instance a solder ball or solder bump can further be applied to the conductive structure on the second surface.

Figure 11A:
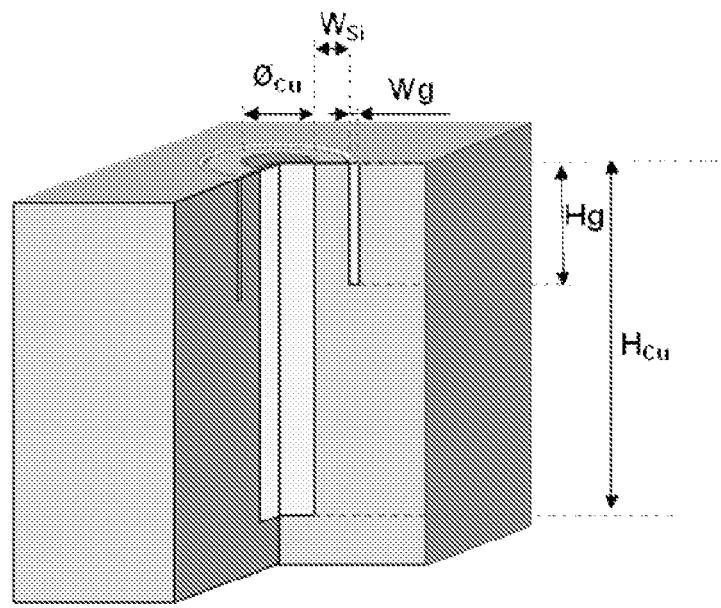
FIG. 11A illustrates a 3D-TSV with a diameter $\varnothing_{Cu}$ having isolating trench-like structures having at least one airgap and remaining (Si) substrate (Si ring) having a width $W_{Si}$ in between the isolating trench-like structure (ring) and the TSV structure according to a particular embodiment.
Figure 11B:
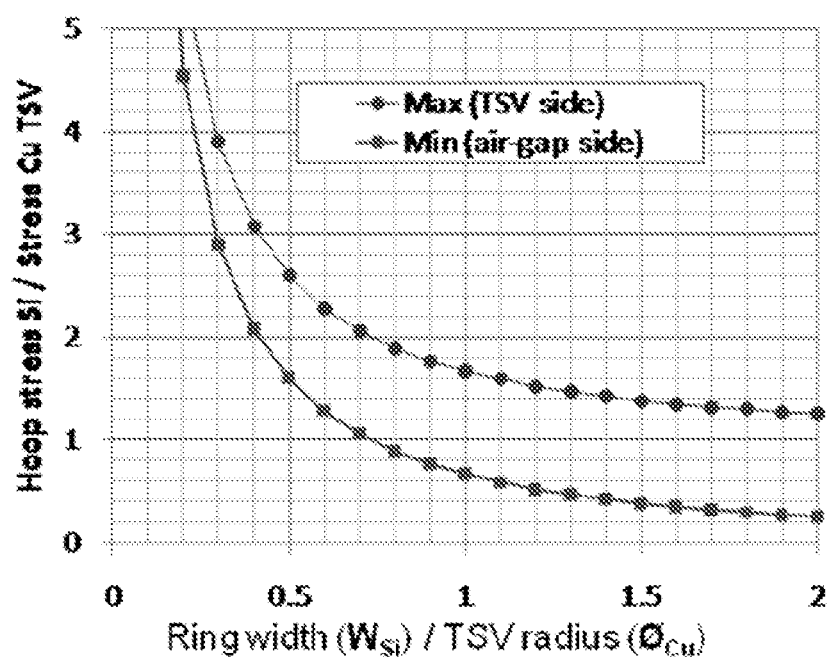
FIG. 11B illustrates the circumferential (hoop-)stress as a function of the width of the remaining substrate ($W_{Si}$) as a function of the diameter of the Cu TSV ($\varnothing_{Cu}$).

According to various embodiments, the circumferential (hoop-) stress or in other words the stress originating from the TSV interconnect structure towards the substrate behind the TSV structure is dependent on the diameter of the TSV interconnect structure and the width of the remaining substrate material ($W_{Si}$) in between the TSV interconnect structure and the isolating trench-like structure. FIG. 11A illustrates a 3D-TSV with a diameter $\varnothing_{Cu}$ having isolating trench-like structures having at least one airgap and remaining (Si) substrate (Si ring) having a width $W_{Si}$ in between the isolating trench-like structure (ring) and the TSV structure according to various embodiments. FIG. 11B illustrates the circumferential (hoop-)stress as a function of the width of the remaining substrate ($W_{Si}$) as a function of the diameter of the Cu TSV ($\varnothing_{Cu}$).

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The foregoing description details certain various embodiments. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A method for providing at least one through silicon via interconnect structure, comprising:
    providing a substrate comprising a substrate material having a first main surface;
    etching, simultaneously, at least one through silicon via hole and at least one isolating trench-like structure using an aspect-ratio-dependent etching, the isolating trench-like structure surrounding the through silicon via hole and being separated from the through silicon via hole by a remaining substrate material, wherein the at least one through silicon via hole has a diameter of from 2 µm to 20 µm and the isolating trench-like structure has a trench width smaller than 1000 nm; thereafter
    depositing a dielectric liner, whereby sidewalls of the etched through silicon via hole are smoothed and whereby an opening of the isolating trench-like structure is pinched off at the first main surface of the substrate, thereby creating a hollow trench-like structure with at least one airgap in the hollow trench-like structure; and thereafter
    depositing a conductive material in the through silicon via hole, whereby a through silicon via interconnect structure surrounded by the hollow trench-like structure is provided,
    wherein more than one silicon via interconnect structure is formed within the hollow trench-like structure.

2. The method according to claim 1, wherein the silicon via interconnect structures are parallel, and wherein the hollow trench-like structure is a hollow trench-like ring structure.

3. The method according to claim 1, wherein the substrate is a silicon wafer having active devices on its first main surface material, wherein the active devices are produced during a preceding front end of line processing.

4. The method according to claim 1, wherein the isolating trench-like structure has a trench width of from 100 nm to 500 nm and the through silicon via hole has a diameter or width of from 2 µm to 20 µm and the isolating trench-like structure has a depth of from 1/5 to 2/3 of a depth of the through silicon via hole.

5. The method according to claim 1, wherein the aspect-ratio-dependent etching is a pulsed etching comprising alternating steps of isotropic etching and passivation.

6. The method according to claim 5, wherein the isotropic etching is a $SF_6$ based plasma etching and wherein the passivation is a C4F8 based plasma passivation.

7. The method according to claim 1, wherein the deposited liner is a tetraethyl orthosilicate liner.

8. The method according to claim 1, wherein depositing a conductive material in the through silicon via hole is performed using an electrochemical deposition technique or a chemical vapor deposition technique, and wherein the conductive material comprises at least one material selected from the group consisting of a metal, copper, nickel, tungsten, a metal alloy, an implanted semiconductor, a conductive silicon, a conducting polymer, and carbon nanotubes.

9. The method according to claim 1, further comprising, after depositing a conductive material in the through silicon via hole, providing metal contacts onto the through silicon via interconnect structure and forming a plurality of back-end-of-line interconnect layers.

10. The method according to claim 1, further comprising thinning a backside of the substrate using a mechanical operation to open the through silicon via interconnect structure from the backside, whereby a three-dimensional through silicon via interconnect structure is formed.

11. A substrate comprising at least one through silicon via interconnect structure prepared by the method according to claim 1, wherein the through silicon via interconnect structure is a three-dimensional through silicon via interconnect structure surrounded by the hollow trench-like structure.

12. A three-dimensional stacked semiconductor device comprising a substrate according to claim 11.

13. A method for providing at least one through silicon via interconnect structure, comprising:
    providing a substrate comprising a substrate material having a first main surface;
    etching, simultaneously, at least one through silicon via hole and at least one isolating trench-like structure using an aspect-ratio-dependent etching, the isolating trench-like structure surrounding the through silicon via hole and being separated from the through silicon via hole by a remaining substrate material, wherein the at least one through silicon via hole has a diameter of from 2 µm to 20 µm and the isolating trench-like structure has a trench width smaller than 1000 nm; thereafter
    depositing a dielectric liner, whereby sidewalls of the etched through silicon via hole are smoothed and whereby an opening of the isolating trench-like structure is pinched off at the first main surface of the substrate, thereby creating a hollow trench-like structure with at least one airgap in the hollow trench-like structure, wherein the dielectric liner is deposited on horizontal parts of the substrate, the sidewalls of the etched through silicon via hole, and within the isolating trench-like structure; and thereafter depositing a conductive material in the through silicon via hole, whereby a through silicon via interconnect structure surrounded by the hollow trench-like structure is provided.

14. The method according to claim 13, wherein the substrate is a silicon wafer having active devices on its first main surface material, wherein the active devices are produced during a preceding front end of line processing.

15. The method according to claim 13, wherein the isolating trench-like structure has a trench width of from 100 nm to 500 nm and the through silicon via hole has a diameter or width of from 2 μm to 20 μm and the isolating trench-like structure has a depth of from 1/5 to 2/3 of a depth of the through silicon via hole.

16. The method according to claim 13, wherein the aspect-ratio-dependent etching is a pulsed etching comprising alternating steps of isotropic etching and passivation.

17. The method according to claim 16, wherein the isotropic etching is a $SF_6$ based plasma etching and wherein the passivation is a C4F8 based plasma passivation.

18. The method according to claim 13, wherein the deposited liner is a tetraethyl orthosilicate liner.

19. The method according to claim 13, wherein depositing a conductive material in the through silicon via hole is performed using an electrochemical deposition technique or a chemical vapor deposition technique, and wherein the conductive material comprises at least one material selected from the group consisting of a metal, copper, nickel, tungsten, a metal alloy, an implanted semiconductor, a conductive silicon, a conducting polymer, and carbon nanotubes.

20. The method according to claim 13, further comprising, after depositing a conductive material in the through silicon via hole, providing metal contacts onto the through silicon via interconnect structure and forming a plurality of back-end-of-line interconnect layers.

21. The method according to claim 13, further comprising thinning a backside of the substrate using a mechanical operation to open the through silicon via interconnect structure from the backside, whereby a three-dimensional through silicon via interconnect structure is formed.

22. A substrate comprising at least one through silicon via interconnect structure prepared by the method according to claim 13, wherein the through silicon via interconnect structure is a three-dimensional through silicon via interconnect structure surrounded by the hollow trench-like structure.

23. A three-dimensional stacked semiconductor device comprising a substrate according to claim 22.

* * * * *